(12) United States Patent
Miyashita et al.

(10) Patent No.: US 7,524,232 B2
(45) Date of Patent: Apr. 28, 2009

(54) WORKPIECE CENTERING APPARATUS AND METHOD OF CENTERING WORKPIECE

(75) Inventors: Tadakazu Miyashita, Nagano (JP); Yosuke Kanai, Nagano (JP)

(73) Assignee: Fujikoshi Machinery Corp., Nagano-Shi (JP)

( * ) Notice: Subject to any disclaimer, the term of this patent is extended or adjusted under 35 U.S.C. 154(b) by 0 days.

(21) Appl. No.: 11/802,867

(22) Filed: May 25, 2007

(65) Prior Publication Data

US 2007/0275639 A1    Nov. 29, 2007

(30) Foreign Application Priority Data

May 29, 2006    (JP) ............... 2006-148942

(51) Int. Cl.
*B24B 49/00*   (2006.01)
*H01L 21/677*  (2006.01)

(52) U.S. Cl. .............. 451/9; 451/11; 451/364; 414/755

(58) Field of Classification Search .......... 451/9, 451/10, 11, 364; 414/755, 780; 198/341.05, 198/341.07; 269/289 R
See application file for complete search history.

(56) References Cited

U.S. PATENT DOCUMENTS

| | | | | |
|---|---|---|---|---|
| 4,507,078 A | * | 3/1985 | Tam et al. .............. 432/11 |
| 4,521,995 A | * | 6/1985 | Sekiya .................. 451/388 |
| 4,625,463 A | * | 12/1986 | Sekiya .................. 451/54 |
| 4,944,650 A | * | 7/1990 | Matsumoto ............. 414/757 |
| 5,267,418 A | * | 12/1993 | Currie et al. ........... 451/364 |
| 6,032,512 A | * | 3/2000 | Li ....................... 73/1.79 |
| 6,283,827 B1 | * | 9/2001 | Vogtmann et al. ........ 451/8 |
| 2004/0046545 A1 | * | 3/2004 | Akiyama et al. ........ 324/158.1 |

FOREIGN PATENT DOCUMENTS

| | | | | |
|---|---|---|---|---|
| JP | 63160233 A | * | 7/1988 |
| JP | 10148788 A | * | 6/1998 |
| JP | 11219998 A | * | 8/1999 |
| JP | 2003-62750 A |   | 3/2003 |

* cited by examiner

*Primary Examiner*—Eileen P. Morgan
(74) *Attorney, Agent, or Firm*—Birch, Stewart, Kolasch & Birch, LLP

(57) ABSTRACT

The workpiece centering apparatus is capable of highly reducing damage of a workpiece. The workpiece centering apparatus comprises: a guide plate being provided in a tray and covering a water inlet so as to horizontally introduce water into the tray; and at least three overflow outlets for overflowing the water from the tray, the overflow outlets being formed in a peripheral wall of the tray and arranged in the circumferential direction at regular intervals. The workpiece, which is horizontally fed on a surface of the water stored in the tray, is received and floated by surface tension of the water. Then, the workpiece is centered in the tray by water flows radially overflowing from the tray via the overflow outlets.

11 Claims, 4 Drawing Sheets

WORKPIECE CENTERING APPARATUS AND METHOD OF CENTERING WORKPIECE

BACKGROUND OF THE INVENTION

The present invention relates to a workpiece centering apparatus and a method of centering a workpiece.

Various types of polishing apparatuses for polishing workpieces have been known.

Each of the polishing apparatuses has a polishing plate, in which polishing cloth is adhered on an upper face, and a top ring pressing a workpiece, which is held on the lower side, onto the polishing cloth. The polishing plate is relatively moved with respect to the top ring so as to polish a lower face of the workpiece.

The workpiece, which has been polished by the polishing apparatus, is put into a tray storing water and washed therein, and then the workpiece is transferred to a next stage, e.g., accommodating cassette, by a holding unit, e.g., robot hand. To hold the workpiece by the holding unit, the workpiece must be centered.

A conventional workpiece centering apparatus is disclosed in Japanese Patent Gazette No. 2003-62750. In the workpiece centering apparatus, water is jetted toward an upper face of a tray so as to form water film, a polished workpiece, which is held on a lower face of a chucking mechanism, is dropped into the tray with jetting water, the polished surface of the workpiece is cleaned by the jetted water, a cylinder rod of an elevating unit is extended upward so as to center the workpiece by picots of a positioning mechanism, the workpiece, whose outer edge has been fixed by the picots, is moved upward until reaching a position above a fringe section of the tray, which is upwardly extended from an outer edge of the tray, and an end part is clamped by a robot arm and transferred to an accommodating cassette.

However, in the conventional workpiece centering apparatus, the workpiece is dropped into the tray and washed, and then the tray is moved upward by the picots, whose upper end parts are formed into tapered shapes, and compulsorily positioned by the tapered parts. Therefore, the picots moving upward apply shocks to the workpiece, so that the workpiece will be damaged. Namely, when the picots are moved upward, a shifted end part of the workpiece, which is not centered, strongly collides with the tapered part of the picot and moved downward along the tapered part, and the other end part of the workpiece collides with the picot, so that the workpiece is centered. With this action, the strong shock is applied to the workpiece by the picots.

SUMMARY OF THE INVENTION

The present invention was conceived to solve the above described problems.

An object of the present invention is to provide a workpiece centering apparatus and a method of centering a workpiece, which are capable of highly reducing damage of the workpiece.

To achieve the object, the present invention has following structures.

Namely, the workpiece centering apparatus of the present invention comprises:

a tray having a peripheral wall;

a water supply section supplying water into the tray via a water inlet provided at a center of a bottom face of the tray;

a guide plate being provided in the tray and separated a prescribed distance away from an inner bottom face of the tray, the guide plate covering the water inlet so as to horizontally introduce the water, which is supplied via the water inlet, into the tray; and at least three overflow outlets for overflowing the water from the tray, the overflow outlets being formed in the peripheral wall and arranged in the circumferential direction at regular intervals, a workpiece, which is horizontally fed on a surface of the water stored in the tray, is received and floated by surface tension of the water, and the workpiece is centered in the tray by water flows radially overflowing from the tray via the overflow outlets.

In the apparatus, drawing forces applied to the workpiece, each of which is caused by viscosity of each of the water flows overflowing via each of the overflow outlets, may be equal.

In the apparatus, the overflow outlets may have the same length and the same height.

In the apparatus, an inner face of the peripheral wall may be a female tapered face, whose diameter is gradually reduced toward the inner bottom face of the tray, and the overflow outlets may be designed to make a diameter of the surface of the water overflowing via the overflow outlets slightly larger than that of the workpiece.

The workpiece centering apparatus may further comprise: a transferring section including; and at least three positioning pins, each of which has an upper end part, a lower end part whose diameter is larger than that of the upper end part, and a tapered part which connects the upper end part and the lower end part; and a driving section for vertically moving the positioning pins, and the workpiece may be received by the positioning pins when the positioning pins are moved upward by the driving section, and then the workpiece is centered.

In the apparatus, the workpiece may be centered and further upwardly moved above the peripheral wall, by moving the positioning pins upward, so as to transfer the workpiece to an external apparatus.

In the apparatus, the workpiece, whose lower face has been polished, may be fed on the surface of the water stored in the tray, and the polished workpiece may be correctly positioned so as to convey the polished workpiece for the next process.

On the other hand, the method of centering a workpiece in a workpiece centering apparatus comprising: a tray having a peripheral wall; a water supply section supplying water into the tray via a water inlet provided at a center of a bottom face of the tray; a guide plate being provided in the tray and separated a prescribed distance away from an inner bottom face of the tray, the guide plate covering the water inlet so as to horizontally introduce the water, which is supplied via the water inlet, into the tray; and at least three overflow outlets for overflowing the water from the tray, the overflow outlets being formed in the peripheral wall and arranged in the circumferential direction at regular intervals, comprises the steps of:

supplying water into the tray by the water supply section;

horizontally feeding the workpiece onto the surface of the water in the tray with overflowing the water via the overflow outlets;

receiving the workpiece floated by surface tension of the water; and centering the workpiece in the tray by water flows radially overflowing from the tray via the overflow outlets.

In the present invention, the workpiece can be centered in the tray without colliding with the tray, so that damaging the workpiece can be highly prevented.

Especially, by employing the positioning pins, the workpiece is tentatively centered in the tray by the water flows radially overflowing from the tray via the overflow outlets. Therefore, the work piece is not compulsorily positioned by the positioning pins moved upward, so that damaging the workpiece can be avoided.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
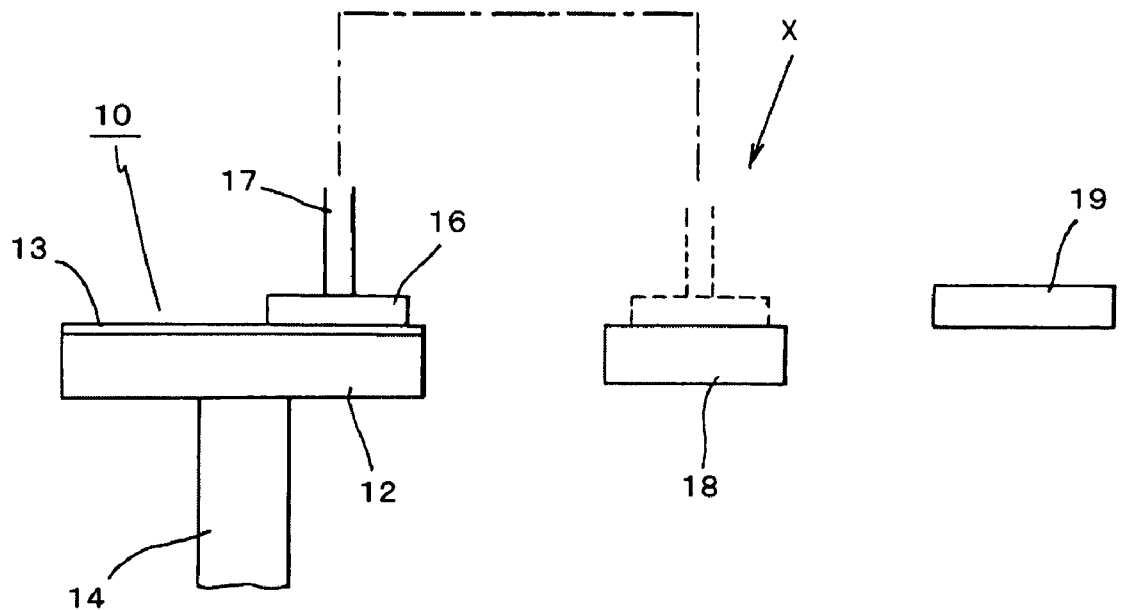
FIG. 1 is an explanation view of a polishing apparatus.

FIG. 1 is an explanation view of a polishing apparatus 10.

In FIG. 1, polishing cloth 13 made of, for example, polyurethane, is adhered on an upper face of a polishing plate 12 by, for example, an adhesive. The polishing plate 12 is rotated in a horizontal plane with a spindle 14. The spindle 14 is rotated by a known driving unit (not shown).

A top ring 16 is fixed to a lower end of a shaft 17. The shaft 17 is rotated about an axial line and moved upward and downward by a known mechanism. The top ring 16 is moved between a first position, at which the top ring 16 is located above the polishing plate 12, and a second position, at which the top ring 16 is located outside of the polishing plate 12.

A workpiece transferring unit 18 is located at a workpiece transferring position X. A workpiece conveying unit 19 has a robot hand (not shown) for conveying a workpiece to be polished to the transferring unit 18 or taking out a polished workpiece from the transferring unit 18.

The workpiece is transferred from the transferring unit 18 to a lower face of the top ring 16, and the top ring 16 presses the workpiece onto the polishing cloth 13 of the polishing plate 12. At that time, the polishing plate 12 and the top ring 16 are rotated, so that the workpiece can be polished. Upon completing the polish, the workpiece is transferred from the top ring 16 to the transferring unit 18, and then the workpiece is taken out from the transferring unit 18 by the robot hand.

Figure 2:
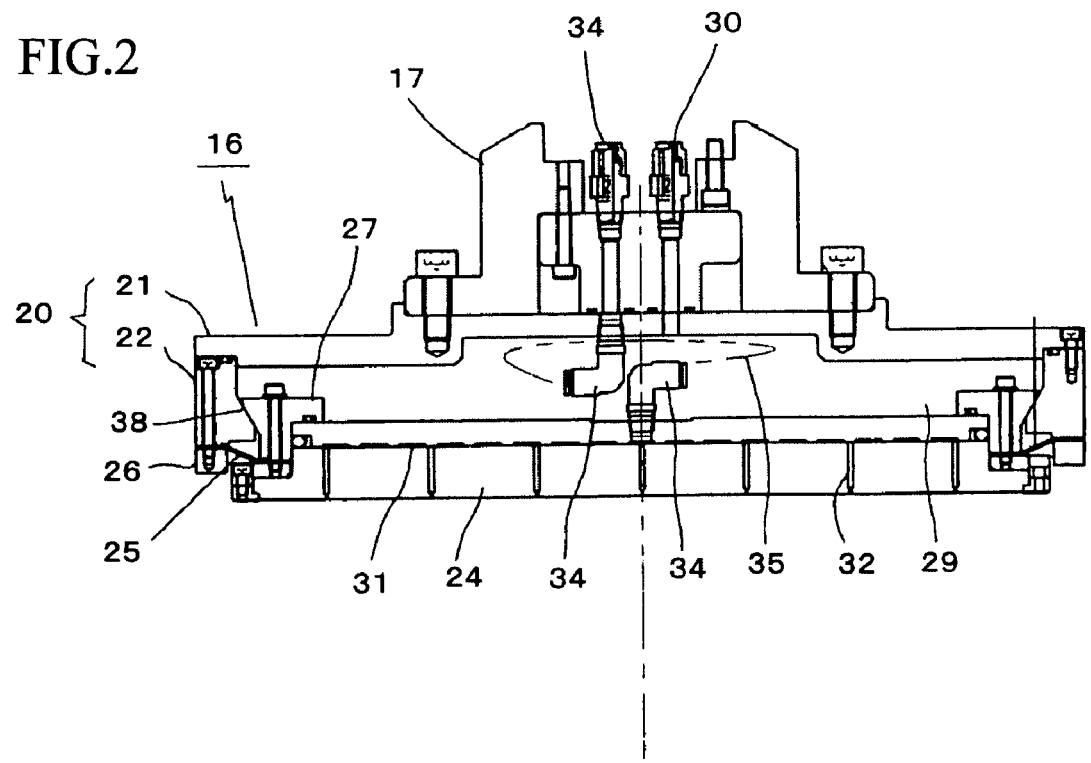
FIG. 2 is a sectional view of a top ring.

FIG. 2 is a sectional view of the top ring 16. The top ring 16 is a known top ring, so its structure will be briefly explained.

A main body section 20 has a ceiling plate 21 fixed to the shaft 17 and a cylindrical part 22 fixed to a lower face of an outer edge part of the ceiling plate 21.

A holding plate 24 is provided in a lower part of the main body section 20. The holding plate 24 is connected to the main body section 20 by a ring-shaped diaphragm, so that the holding plate 24 can be moved upward and downward. Namely, an outer edge of the diaphragm 25 is fixed to a lower face of the cylindrical part by a fixing member 26; an inner edge of the diaphragm 25 is fixed to an outer edge part of the holding plate 24 by a fixing member 27.

A first chamber 29 is formed between the main body section 20 and the holding plate 24 and tightly closed by the diaphragm 25. A pressurized fluid is introduced into the first chamber 29 from a pressure source (not shown) via a joint 30. With this structure, the workpiece can be pressed onto the polishing cloth 13.

Second chambers 31 are coaxially formed in the holding plate 24. The second chambers 31 are mutually communicated by radially-extended grooves (not shown). Many small holes 32, which are communicated to the second chambers 31, are uniformly formed in a lower face of the holding plate 24.

Figure 3:
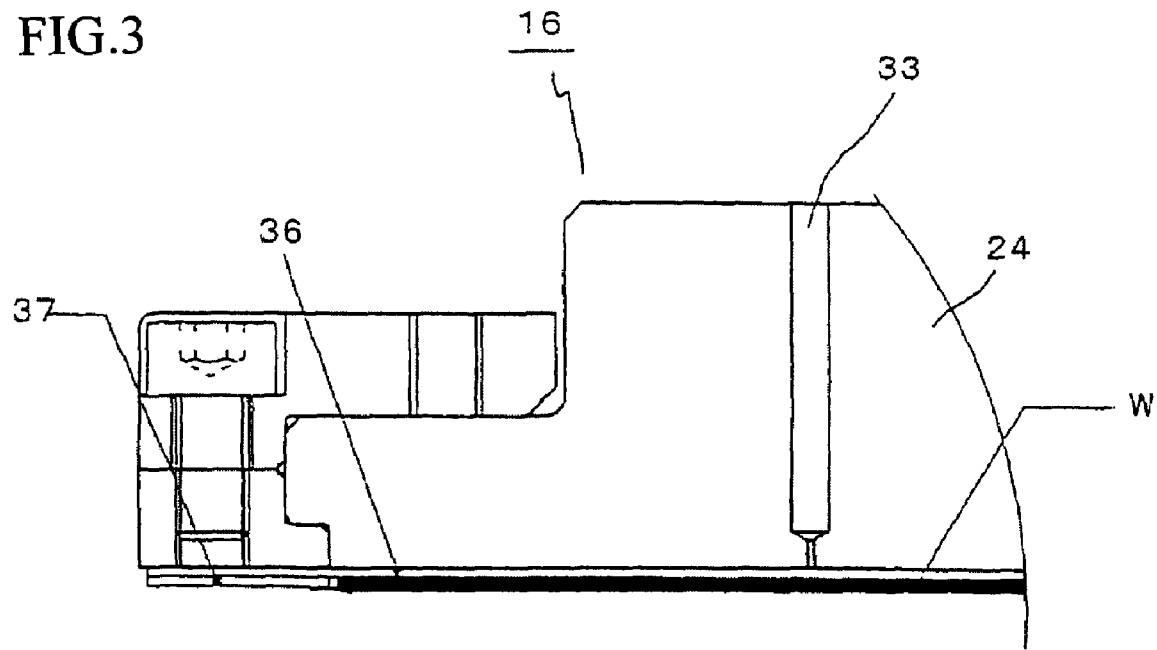
FIG. 3 is a partial enlarged view of the top ring.

The pressurized fluid is introduced into the second chambers 31 from the pressure source (not shown) via a joint 34 and a pipe 35, and the fluid is jetted out from the lower face of the holding plate 24 via the fine holes 32. As shown in FIG. 3, a bucking pad 36 having fine holes is provided to the lower face of the holding plate 24, an ring-shaped template 37 is provided on a lower face of an outer edge part of the bucking pad 36. The fluid jetted out from the lower face of the holding plate 24 is further jetted out from the lower face of the bucking pad 36 via the fine holes. With this structure, the workpiece W is pressed onto the polishing cloth 13 by the jetted fluid.

To hold the workpiece W, the fluid in the second chambers 31 is sucked, so that the workpiece W is sucked and held on the lower face of the bucking pad 36.

Note that, an inner face of the cylindrical part 22 is a female tapered face, and an outer face of the fixing member 27 is a male tapered face, so that the both faces mutually engage and form an engaged part 38. By the engaged part 38, the holding plate 24 can be centered and stayed in the main body section 20.

The present invention is characterized by the workpiece transferring unit 18, which acts as the workpiece centering apparatus.

The workpiece centering apparatus and the method of centering the workpiece will be explained with reference to FIGS. 4 and 5.

Figure 4:
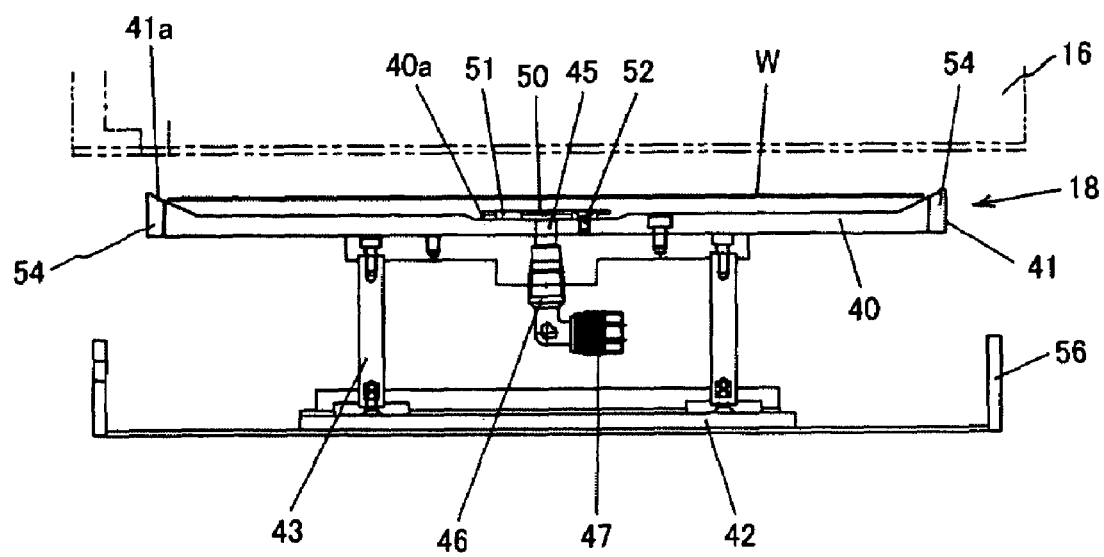
FIG. 4 is a sectional view of a workpiece centering apparatus of a first embodiment.
Figure 5:
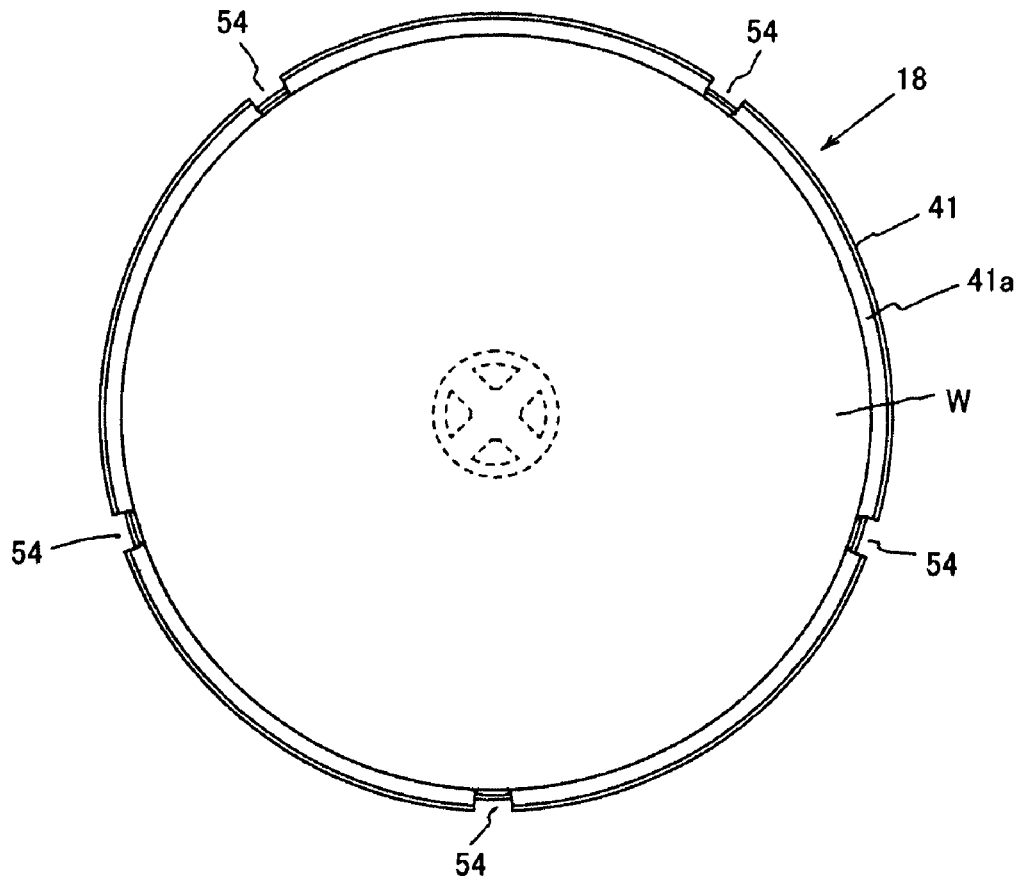
FIG. 5 is a plan view of the workpiece centering apparatus shown in FIG. 4.

A first embodiment of the workpiece transferring unit 18 is shown in FIGS. 4 and 5.

A tray 40 has a peripheral wall 41 and is horizontally supported on a base 42 by a plurality of supporting rods 43. Preferably, an inner face 41a of the peripheral wall 41 is a female tapered face, whose diameter is gradually reduced toward an inner bottom face of the tray 40.

The center of the inner bottom face of the tray 40 is located in a lower part 40a, whose level is lower than other parts thereof. A water inlet 45 is provided at the center in the lower part 40a, and a water supply pipe 46 is connected to the water inlet 45. A joint 47 is provided to one end of the water supply pipe 46, and a water supply hose (not shown) can be detachably attached to the water supply hose 46 by the joint 47. The water supply hose is connected to a water source (not shown). A water supply section is constituted by the water supply pipe 46, the joint 47, etc.

A guide plate 50 is provided in the inner bottom face of the tray 40 and covers the water inlet 45. The guide plate 50 is separated a prescribed distance away from the inner bottom face (the lower part 40a) of the tray 40 by a plurality of pillars 51 and fixed by screws 52. The water supplied from the water inlet 45 collides with a lower face of the guide plate 50, and then the water is horizontally introduced outward and introduced into the tray 40 via spaces formed between the pillars 51. Since the water once collides with the guide plate 50 and is introduced into the tray 40, the water can spread in the tray 40 without waving its surface.

Overflow outlets 54 for overflowing the water are formed in the peripheral wall 41 of the tray 40 by notching the peripheral wall 41 and arranged in the circumferential direction at regular intervals. The notched overflow outlets 54 have the same length and the same height. By forming the overflow outlets 54, a fixed amount of the water can overflow from each of the overflow outlets 54 of the tray 40 at the same speed. In the present embodiment, the heights, etc. of the overflow outlets 54 are designed to make a diameter of the surface of the water overflowing via the overflow outlets 54 slightly larger than that of the workpiece W.

At least three overflow outlets 54 must be formed. Note that, the concept of the overflow outlets 54 includes through-holes having the same size and the same height.

The structure of the workpiece centering apparatus 18 will be explained.

When the top ring 16 is moved to a position above the centering apparatus 18 and the second chambers 31 are pressurized, the workpiece W, e.g., wafer, whose lower face has been polished by the polishing apparatus 10, is released from the lower face of the top ring 16 to horizontally fall into the center part of the tray 40.

At that time, the water is supplied into the tray 40 via the water inlet 45, the supplied water collides with the guide plate 50 and horizontally spreads in the tray 40 without waving its surface, and the water is introduced outside of the tray 40 via the overflow outlets 54, from each of which the fixed amount of water overflows at the same speed.

The workpiece W, which has been fed onto the surface of the water stored in the tray 40 from the top ring 16, received and supported by surface tension of the water. Since the water in the tray 40 is radially overflowing from the overflow outlets 54 at the same flow speed as described above, the workpiece W is centered in the tray 40 by the water flows. The workpiece W is centered and cleaned. Note that, the water overflowed from the tray 40 is discharged by a gutter 56.

In the present embodiment, the overflow outlets 54 have the same length and the same height so as to overflowing the water therefrom at the same flow speed and center the workpiece W in the tray 40, but the present invention is not limited to this manner. Namely, the size and the height of the overflow outlets 54 is designed so as to make drawing forces applied to the workpiece W, each of which is caused by viscosity of each of the water flows overflowing via each of the overflow outlets 54, equal, so that the workpiece W can be centered in the tray 40.

As described above, the overflow outlets 54 are designed to make the diameter of the surface of the water overflowing via the overflow outlets 54 slightly larger than that of the workpiece W. Therefore, the workpiece W is initially fallen into the center part of the tray 40, and then the workpiece W is centered and kept at the center by the radial water flows, which have the same flow speed. Note that, even if the workpiece W is eccentrically fallen into the tray 40 and one outer part of the workpiece W collides with the female tapered face 41a, the workpiece W is immediately floated on the surface of the water by buffer action of the water. Therefore, the workpiece W is not so damaged.

The workpiece W, which has been centered in the tray 40, is held by a proper holding unit having a chucking mechanism (not shown) and conveyed to the next stage, e.g., accommodating cassette. Note that, in case of chucking three points of the outer edge of the workpiece W, extended parts, in which chucking members of the chucking mechanism can respectively enter, may be formed in the tray 40 so as to hold the workpiece W in the tray 40. Further, the workpiece W may be held by sucking the center part of the upper face of the workpiece W by a sucking mechanism of the holding unit.

As described above, the workpiece W is centered in the tray 40 without contact the tray 40, so that damaging the workpiece W can be highly prevented.

Figure 6:
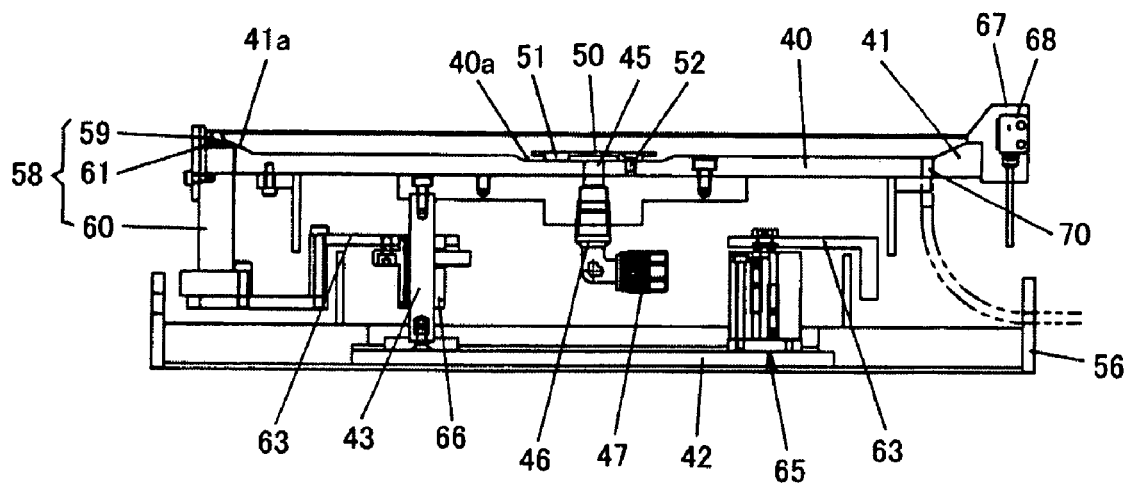
FIG. 6 is a sectional view of a workpiece centering apparatus of a second embodiment.
Figure 7:
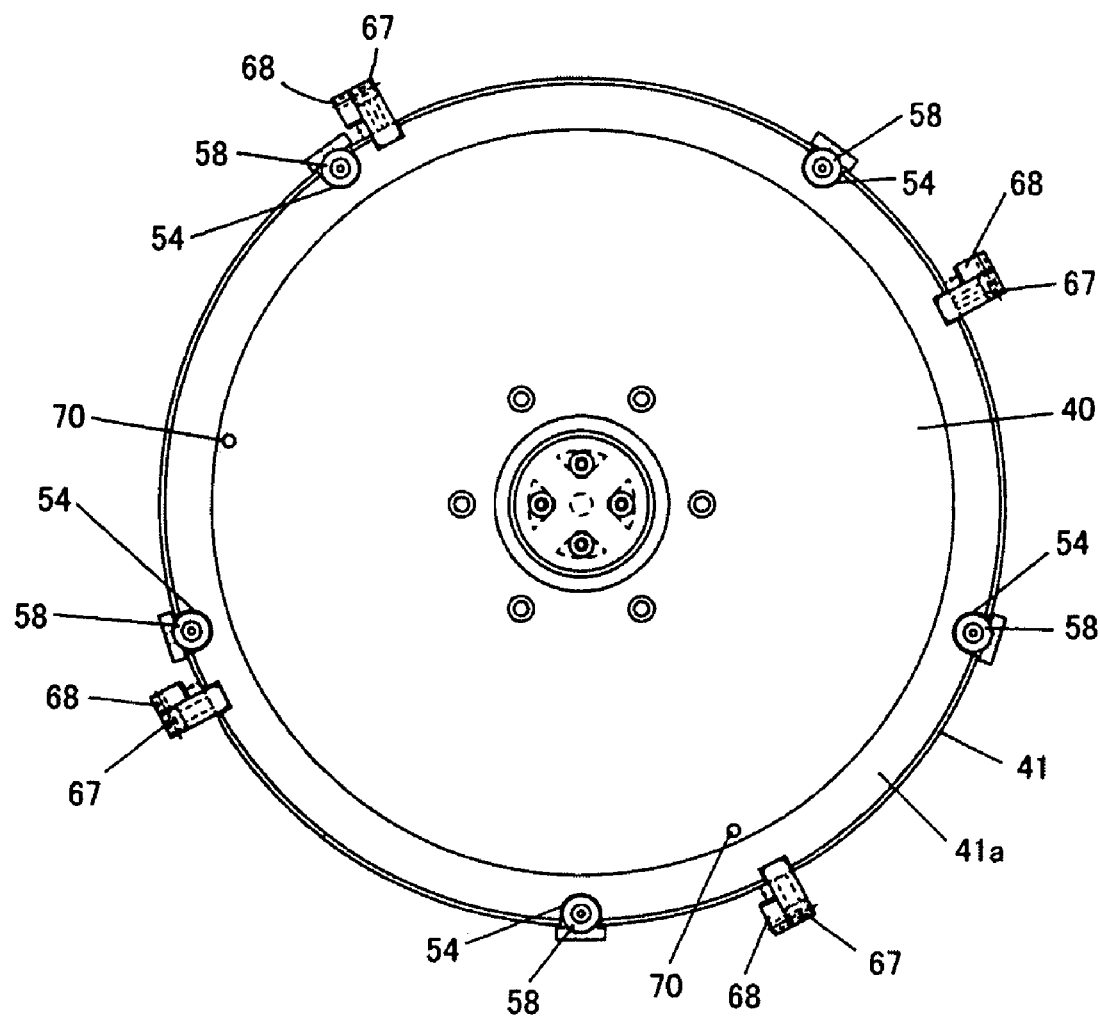
FIG. 7 is a plan view of the workpiece centering apparatus shown in FIG. 6.

Successively, a second embodiment of the workpiece centering apparatus 18 will be explained with reference to FIGS. 6 and 7. Note that, the structural elements explained in the first embodiment are assigned the same symbols and explanation will be omitted.

In the second embodiment too, the tray 40 has the peripheral wall 41 including the overflow outlets 54.

Each of positioning pins 58 has: an upper end part 59 having a tapered end; a lower end part 60 whose diameter is larger than that of the upper end part 59; and a tapered part 61 which connects the upper end part 59 and the lower end part 60. At least three positioning pins 58 must be provided. In the present embodiment, five positioning pins 58 are provided (see FIG. 7). The positioning pins 58 correspond to the outer edge part of the tray 40, and their upper ends enter the tray 40. Further, the positioning pins 58 can be moved upward and downward.

Lower ends of the positioning pins 58 are respectively supported by arms 63, which are radially arranged under the tray 40, and the arms 63 are vertically moved by a driving section 65, e.g., cylinder unit, so that the positioning pins 58 can be moved upward and downward. Note that, a guide cylinder 66 of the arm 63 is guided by the supporting rod 43, so that the up-down motion of the arm 63 is guided.

In the second embodiment, the positioning pins 58 are respectively moved in half cylinder grooves, which are formed in the peripheral wall 41 and extended in the vertical direction. The half cylinder grooves longitudinally intersect the mid part of the female tapered face 41a so as to form the overflow outlets 54. Therefore, edges of the half cylinder grooves in the female tapered face 41a act as the overflow outlets 54.

Four stoppers 67 are provided to the outer edge of the tray 40. Inner side faces of the stoppers 67 are slope faces. With this structure, even if the workpiece W is greatly shifted outward in the tray 40, the stoppers 67 prevent the workpiece W from falling outside of the tray 40.

Optical sensors 70 are provided on a bottom face of the outer edge part of the tray 40. The optical sensors 70 emit light toward the workpiece W and receive the reflected light reflected from the workpiece W. Therefore, the optical sensors 70 can detect if the workpiece W is fed into the tray 40 or not. Transmission sensors 68 detect an abnormal state of the workpiece W so as to stop further actions. For example, if the transmission sensors 68 detect the work piece W being greatly shifted with respect to the tray 40 and engaged with the stoppers 67, the next action, e.g., conveying the workpiece W is stopped.

In the centering apparatus 18 of the second embodiment, the water is supplied into the tray 40 via the water inlet 45, the supplied water collides with the guide plate 50 and horizontally spreads in the tray 40 without waving its surface, and the water is introduced outside of the tray 40 via the overflow outlets 54, from each of which the fixed amount of water overflows at the same speed.

The positioning pins 58 are initially located at the lower-most positions under the surface of the water.

When the top ring 16 is moved to the position above the centering apparatus 18 and the second chambers 31 are pressurized, the workpiece W, e.g., wafer, whose lower face has been polished by the polishing apparatus 10, is released from the lower face of the top ring 16 to horizontally fall into the center part of the tray 40, as well as the first embodiment.

The workpiece W, which has been fed onto the surface of the water stored in the tray 40 from the top ring 16, received and supported by surface tension of the water. Since the water in the tray 40 is radially overflowing from the overflow outlets 54 at the same flow speed as described above, the workpiece W is centered in the tray 40 by the water flows. The workpiece W is centered and cleaned.

Next, the cylinder unit 65 is driven so as to softly move the arms 63 and the positioning pins 58 upward, so that the workpiece W, which has been tentatively centered, is received by the tapered parts 61 of the positioning pins 58 and correctly centered.

The positioning pins 58 are further moved upward until the workpiece W reaches a position above the upper end of the peripheral wall 41 of the tray 40. By lifting the workpiece W to the position above the upper end of the peripheral wall 41, the workpiece W can be easily held by the holding unit having the chucking mechanism or the sucking mechanism and conveyed to the next stage, e.g., accommodating cassette.

In the second embodiment, the workpiece W is tentatively centered in the tray 40 by the water flows overflowing from the overflow outlets 54. In the conventional apparatus, shocks are applied to the workpiece when the workpiece is compulsorily positioned. On the other hand, even if the positioning pins 58 are moved upward, no such shocks are applied to the workpiece W so that damaging the workpiece W can be prevented.

The workpiece centering apparatus of the second embodiment can be used for not only the above described unloading process to transfer the polished workpiece W but also a loading process, in which a workpiece W to be polished is taken out from a cassette by a sucking unit, the workpiece W is fallen into the tray 40 and centered, and then moved upward to transfer the top ring 16.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A workpiece centering apparatus comprising:
a tray having a peripheral wall;
a water supply section supplying water into said tray via a water inlet provided at a center of a bottom face of said tray;
a guide plate being provided in said tray and separated a prescribed distance away from an inner bottom face of said tray, said guide plate covering the water inlet so as to horizontally introduce the water, which is supplied via the water inlet, into the tray; and
at least three overflow outlets for overflowing the water from said tray, said overflow outlets being formed in the peripheral wall and arranged in the circumferential direction at regular intervals,
wherein a workpiece, which is horizontally fed on a surface of the water stored in said tray, is received and floated by surface tension of the water, and the workpiece is centered in said tray by water flows radially overflowing from said tray via said overflow outlets,
wherein an inner face of the peripheral wall is a female tapered face, whose diameter is gradually reduced toward the inner bottom face of said tray, and the overflow outlets are designed to make a diameter of the surface of the water overflowing via the overflow outlets slightly larger than that of the workpiece.

2. The workpiece centering apparatus according to claim 1, wherein drawing forces applied to the workpiece, each of which is caused by viscosity of each of the water flows overflowing via each of the overflow outlets, are equal.

3. The workpiece centering apparatus according to claim 1, wherein the overflow outlets have the same length and the same height.

4. The workpiece centering apparatus according to claim 1, wherein the workpiece, whose lower face has been polished, is fed on the surface of the water stored in said tray, and the polished workpiece is correctly positioned so as to convey the polished workpiece for the next process.

5. A workpiece centering apparatus, comprising:
a tray having a peripheral wall;
a water supply section supplying water into said tray via a water inlet provided at a center of a bottom face of said tray;
a guide plate being provided in said tray and separated a prescribed distance away from an inner bottom face of said tray, said guide plate covering the water inlet so as to horizontally introduce the water, which is supplied via the water inlet, into the tray; and
at least three overflow outlets for overflowing the water from said tray, said overflow outlets being formed in the peripheral wall and arranged in the circumferential direction at regular intervals,
wherein a workpiece, which is horizontally fed on a surface of the water stored in said tray, is received and floated by surface tension of the water, and the workpiece is centered in said tray by water flows radially overflowing from said tray via said overflow outlets,
further comprising a transferring section including:
at least three positioning pins, each of which has an upper end part, a lower end part whose diameter is larger than that of the upper end part, and a tapered part which connects the upper end part and the lower end part; and
a driving section for vertically moving the positioning pins,
wherein the workpiece is received by the positioning pins when the positioning pins are moved upward by the driving section, and then the workpiece is centered.

6. The workpiece centering apparatus according to claim 5, wherein the workpiece is centered and further upwardly moved above the peripheral wall, by moving the positioning pins upward, so as to transfer the workpiece to an external apparatus.

7. The workpiece centering apparatus according to claim 5, wherein drawing forces applied to the workpiece, each of which is caused by viscosity of each of the water flows overflowing via each of the overflow outlets, are equal.

8. The workpiece centering apparatus according to claim 5, wherein the overflow outlets have the same length and the same height.

9. The workpiece centering apparatus according to claim 5, wherein the workpiece, whose lower face has been polished, is fed on the surface of the water stored in said tray, and the polished workpiece is correctly positioned so as to convey the polished workpiece for the next process.

10. A method of centering a workpiece in a workpiece centering apparatus comprising: a tray having a peripheral wall; a water supply section supplying water into said tray via a water inlet provided at a center of a bottom face of said tray; a guide plate being provided in said tray and separated a prescribed distance away from an inner bottom face of said tray, said guide plate covering the water inlet so as to horizontally introduce the water, which is supplied via the water inlet, into the tray; and at least three overflow outlets for overflowing the water from said tray, said overflow outlets being formed in the peripheral wall and arranged in the circumferential direction at regular intervals, wherein an inner face of the peripheral wall is a female tapered face, whose diameter is gradually reduced toward the inner bottom face of said tray, and the overflow outlets are designed to make a diameter of the surface of the water overflowing via the overflow outlets slightly larger than that of the workpiece, said method comprising the steps of:

supplying water into said tray by said water supply section;

horizontally feeding the workpiece onto the surface of the water in said tray with overflowing the water via said overflow outlets;

receiving the workpiece floated by surface tension of the water; and centering the workpiece in said tray by water flows radially overflowing from said tray via said overflow outlets.

11. A method of centering a workpiece in a workpiece centering apparatus comprising: a tray having a peripheral wall; a water supply section supplying water into said tray via a water inlet provided at a center of a bottom face of said tray; a guide plate being provided in said tray and separated a prescribed distance away from an inner bottom face of said tray, said guide plate covering the water inlet so as to horizontally introduce the water, which is supplied via the water inlet, into the tray; and at least three overflow outlets for overflowing the water from said tray, said overflow outlets being formed in the peripheral wall and arranged in the circumferential direction at regular intervals, and further comprising a transferring section including:

at least three positioning pins, each of which has an upper end part, a lower end part whose diameter is larger than that of the upper end part, and a tapered part which connects the upper end part and the lower end part; and a driving section for vertically moving the positioning pins, wherein the workpiece is received by the positioning pins when the positioning pins are moved upward by the driving section, and then the workpiece is centered, said method comprising the steps of:

supplying water into said tray by said water supply section;

horizontally feeding the workpiece onto the surface of the water in said tray with overflowing the water via said overflow outlets;

receiving the workpiece floated by surface tension of the water; and centering the workpiece in said tray by water flows radially overflowing from said tray via said overflow outlets.

\* \* \* \* \*